(12) United States Patent
Tanaka

(10) Patent No.: US 12,495,690 B2
(45) Date of Patent: Dec. 9, 2025

(54) DISPLAY DEVICE

(71) Applicant: Sharp Display Technology Corporation, Kameyama (JP)

(72) Inventor: Yuji Tanaka, Kameyama (JP)

(73) Assignee: Sharp Display Technology Corporation, Kameyama (JP)

( * ) Notice: Subject to any disclaimer, the term of this patent is extended or adjusted under 35 U.S.C. 154(b) by 105 days.

(21) Appl. No.: 18/573,023

(22) PCT Filed: Aug. 30, 2021

(86) PCT No.: PCT/JP2021/031744
§ 371 (c)(1),
(2) Date: Dec. 21, 2023

(87) PCT Pub. No.: WO2023/032002
PCT Pub. Date: Mar. 9, 2023

(65) Prior Publication Data
US 2024/0292696 A1 Aug. 29, 2024

(51) Int. Cl.
*H10K 59/32* (2023.01)
*G09G 3/32* (2016.01)
(Continued)

(52) U.S. Cl.
CPC .............. *H10K 59/32* (2023.02); *G09G 3/32* (2013.01); *G09G 3/3413* (2013.01);
(Continued)

(58) Field of Classification Search
CPC ........ H10K 59/32; H10K 59/12; H10K 59/35; H10K 59/70; G09G 3/32; G09G 3/3413;
(Continued)

(56) References Cited

U.S. PATENT DOCUMENTS 7,687,983 B2 * 3/2010 Lee .................. H10K 59/90
                                                     313/506
8,184,172 B2 * 5/2012 Nakaseko .......... H04N 25/445
                                                   348/229.1
(Continued)

FOREIGN PATENT DOCUMENTS

JP     2006147555 A     6/2006
JP     2010183558 A     8/2010
(Continued)

*Primary Examiner* — Vijay Shankar
(74) *Attorney, Agent, or Firm* — ScienBiziP, P.C.

(57) ABSTRACT

A display device includes: a transparent light-emitting layer; and a display layer. The transparent light-emitting layer has a first light-emitting pixel and a second light-emitting pixel emitting light respectively in a first color and a second color, The display layer has: a first display pixel disposed in association with the first light-emitting pixel and the second light-emitting pixel, and emitting light in a third color; and a second display pixel provided adjacent to the first display pixel and emitting light in the first color. The transparent light-emitting layer further has a third light-emitting pixel and a fourth light-emitting pixel arranged in association with the second display pixel, and emitting light respectively in the second color and the third color.

11 Claims, 16 Drawing Sheets

(51) Int. Cl.
*G09G 3/34* (2006.01)
*G09G 3/36* (2006.01)
*H10K 59/12* (2023.01)
*H10K 59/35* (2023.01)
*H10K 59/70* (2023.01)

(52) U.S. Cl.
CPC ........... *G09G 3/3607* (2013.01); *H10K 59/12* (2023.02); *H10K 59/35* (2023.02); *H10K 59/70* (2023.02); *G09G 2300/0452* (2013.01); *G09G 2310/08* (2013.01); *G09G 2320/0242* (2013.01); *G09G 2340/0435* (2013.01); *G09G 2360/12* (2013.01)

(58) Field of Classification Search
CPC ......... G09G 3/3607; G09G 2300/0452; G09G 2310/08; G09G 2320/0242; G09G 2340/0435; G09G 2360/12; G09G 3/20; G09G 3/30; G09G 3/3233; G09G 3/36; G09F 9/30; H05B 33/12
See application file for complete search history.

(56) References Cited

U.S. PATENT DOCUMENTS

| | | | | |
|---|---|---|---|---|
| 8,410,682 | B2* | 4/2013 | Lee | ........................ H10K 59/32 |
| | | | | 313/506 |
| 10,620,478 | B2* | 4/2020 | Chen | .................. G02F 1/133514 |
| 2006/0138418 | A1 | 6/2006 | Lee et al. | |
| 2010/0144072 | A1 | 6/2010 | Lee et al. | |
| 2010/0171873 | A1 | 7/2010 | Nakaseko | |
| 2017/0343859 | A1 | 11/2017 | Chen | |
| 2025/0081772 | A1* | 3/2025 | Shin | ..................... H10K 59/131 |
| 2025/0185369 | A1* | 6/2025 | Choi | ........................ H10D 86/60 |

FOREIGN PATENT DOCUMENTS

| | | |
|---|---|---|
| JP | 2013243048 A | 12/2013 |
| JP | 2018013622 A | 1/2018 |
| JP | 2018022133 A | 2/2018 |

* cited by examiner

DISPLAY DEVICE

TECHNICAL FIELD

The disclosure relates to a display device that achieves both a high frame rate and a high resolution.

BACKGROUND ART

A known display device includes a display panel having an organic EL element. The organic EL element includes a first light-emitting layer and a second light-emitting layer formed to overlap with each other (Patent Document 1). In this display device, a glass base material is alternately provided with: a pixel including a first light-emitting layer in which a light-emitting element in a first color is formed, and a second light-emitting layer in which a light-emitting element in a second color and a light-emitting element in a third color are formed; and a pixel including a second light-emitting layer in which a light-emitting element in the first color is formed, and a first light-emitting layer in which a light-emitting element in the second color and a light-emitting element in the third color are formed.

CITATION LIST

Patent Literature

[Patent Document 1] Japanese Unexamined Patent Application Publication No. 2013-243048

SUMMARY

Technical Problem

The display device described in Patent Document 1 can display a full-color video in three or more colors, with either the first light-emitting layer alone or the second light-emitting layer alone. However, the light-emitting elements in the first to third colors of the first light-emitting layers are the same in resolution as the light-emitting elements in the first to third colors of the second light-emitting layers. Hence, the display device cannot display videos with different resolutions.

An aspect of the disclosure is set out to provide a display device capable of displaying videos in various resolutions.

Solution to Problem

In order to solve the above problem, a display device according to an aspect of the disclosure includes: a transparent light-emitting layer provided toward a viewing surface; and a display layer provided across from the viewing surface. The transparent light-emitting layer has a first light-emitting pixel and a second light-emitting pixel that are provided adjacent to each other in a first direction parallel to the viewing surface, and that emit light respectively in a first color and a second color different from each other. The display layer has: a first display pixel that is disposed in association with the first light-emitting pixel and the second light-emitting pixel, and that emits light in a third color different from the first color and the second color; and a second display pixel that is provided adjacent to the first display pixel in the first direction, and that emits light in the first color. The transparent light-emitting layer further has a third light-emitting pixel and a fourth light-emitting pixel that are arranged in association with the second display pixel, and that emit light respectively in the second color and the third color.

Advantageous Effects of Disclosure

An aspect of the disclosure can display videos in various resolutions.

DESCRIPTION OF EMBODIMENTS

First Embodiment

Figure 1:
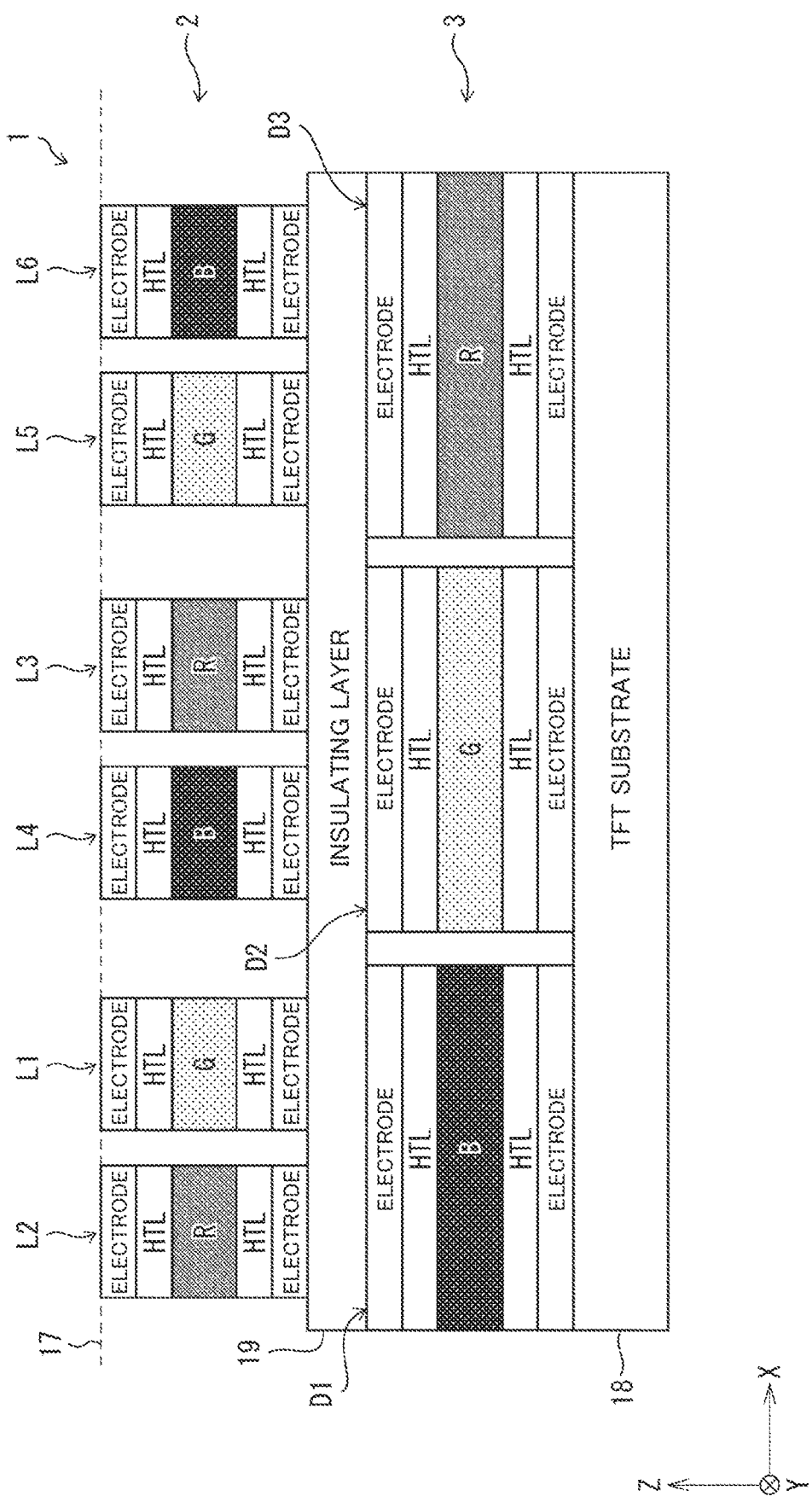
FIG. 1 is a cross-sectional view of a display device according to a first embodiment.
Figure 2:
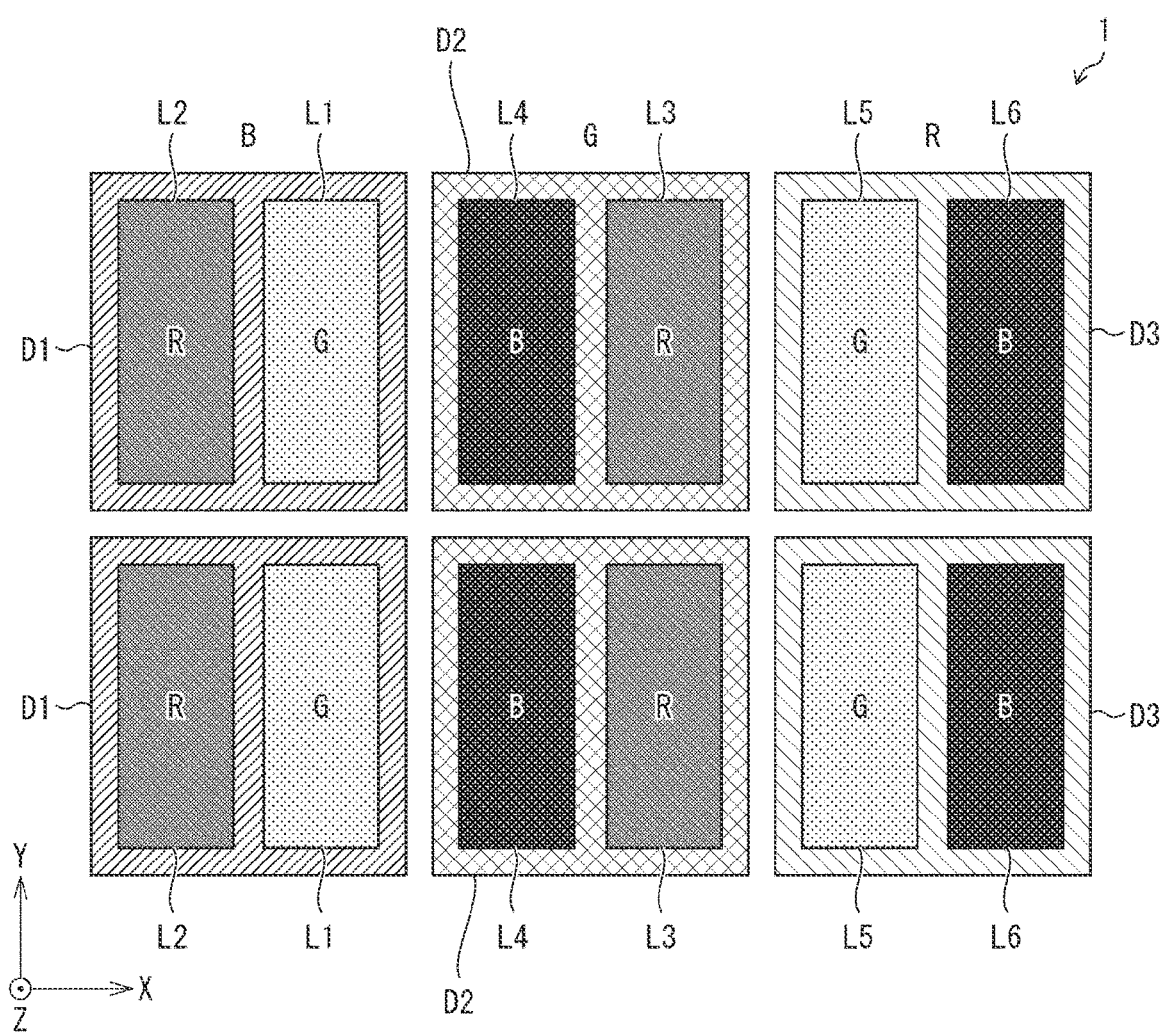
FIG. 2 is a plan view of the display device observed from a viewing surface.
Figure 3:
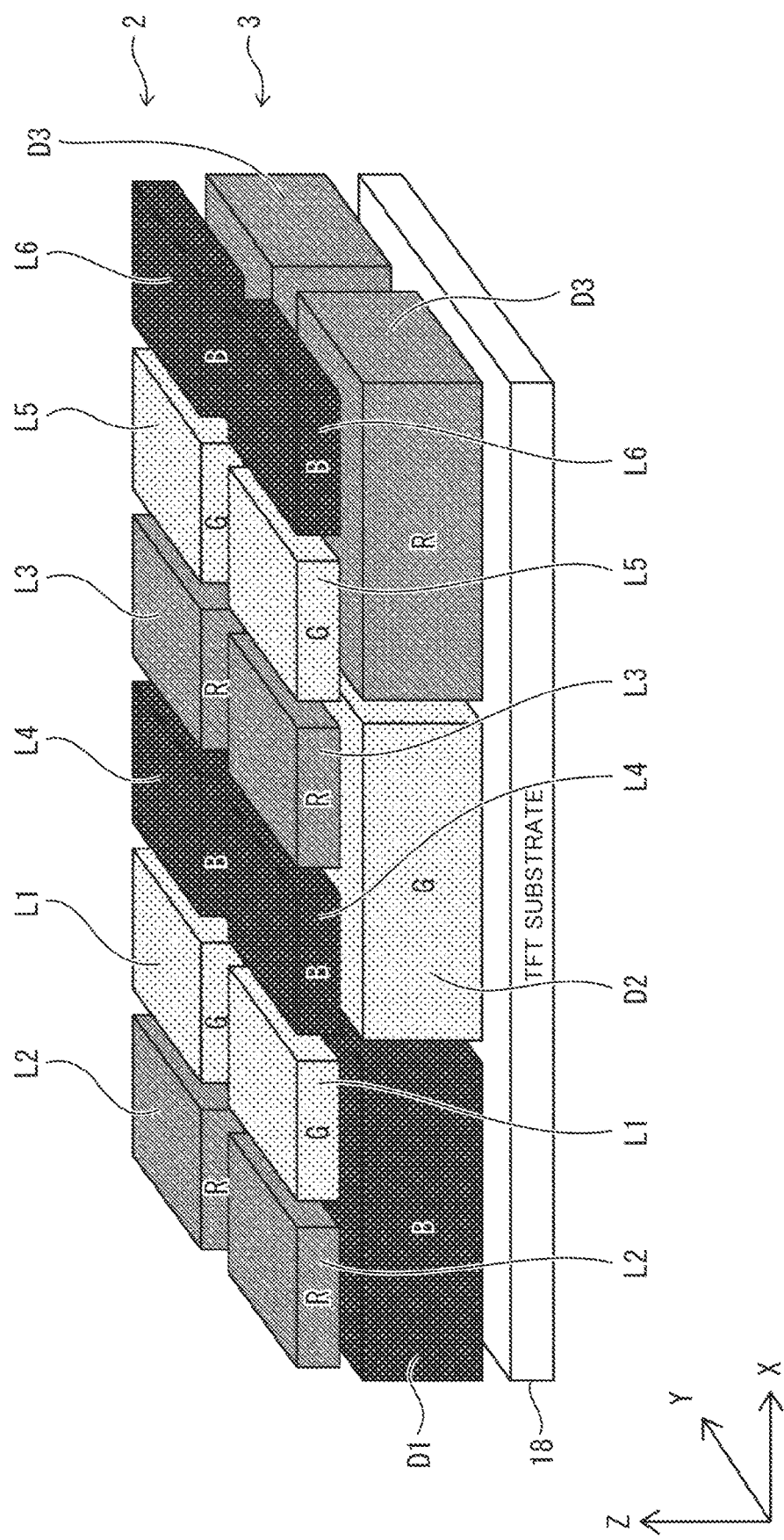
FIG. 3 is a perspective view of an essential portion of the display device.

FIG. 1 is a cross-sectional view of a display device 1 according to a first embodiment. FIG. 2 is a plan view of the display device 1 observed from a viewing surface. FIG. 3 is a perspective view of an essential portion of the display device 1.

The display device 1 includes: a transparent light-emitting layer 2 provided toward a viewing surface 17; and a display layer 3 provided across from the viewing surface 17. The display layer 3 is formed on a TFT substrate 18. On the display layer 3, an insulating layer 19 is formed. The transparent light-emitting layer 2 is formed on the insulating layer 19.

The transparent light-emitting layer 2 has a first light-emitting pixel L1 and a second light-emitting pixel L2 that are provided adjacent to each other in a first direction (an X-direction) parallel to the viewing surface 17, and that emit light respectively in a first color (green) and a second color (red) different from each other.

The display layer 3 has: a first display pixel D1 that is disposed in association with the first light-emitting pixel L1 and the second light-emitting pixel L2, and that emits light in a third color (blue) different from the first color (green) and the second color (red); and a second display pixel D2 that is provided adjacent to the first display pixel D1 in the X-direction, and that emits light in the first color (green).

The transparent light-emitting layer 2 further has a third light-emitting pixel L3 and a fourth light-emitting pixel L4 that are arranged in association with the second display pixel D2, and that emit light respectively in the second color (red) and the third color (blue).

The first light-emitting pixel L1 and the fourth light-emitting pixel L4 are provided adjacent to each other in the X-direction.

The display layer 3 further has a third display pixel D3 that is provided adjacent to the second display pixel D2 in the X-direction, and that emits light in the second color (red).

The transparent light-emitting layer 2 further has a fifth light-emitting pixel L5 and a sixth light-emitting pixel L6 that are arranged in association with the third display pixel D3, and that emit light respectively in the first color (green) and the third color (blue).

As illustrated in FIGS. 2 and 3, first display pixels D1 are arranged adjacent to each other in a Y-direction. Second display pixels D2 are arranged adjacent to each other in the Y-direction. Third display pixels D3 are arranged adjacent to each other in the Y-direction.

First light-emitting pixels L1 are arranged adjacent to each other in the Y-direction. Second light-emitting pixels L2 are arranged adjacent to each other in the Y-direction. Third light-emitting pixels L3 are arranged adjacent to each other in the Y-direction. Fourth light-emitting pixels L4 are arranged adjacent to each other in the Y-direction. Fifth light-emitting pixels L5 are arranged adjacent to each other in the Y-direction. Sixth light-emitting pixels L6 are arranged adjacent to each other in the Y-direction.

Each of the first to sixth light-emitting pixels L1, L2, L3, L4, L5, and L6, and the first to third display pixels D1, D2, and D3 includes: a pair of electrodes; a quantum dot layer (an electroluminescent layer) formed between the pair of electrodes; a hole transport layer formed between one of the pair of electrodes and the quantum dot layer; and an electron transport layer formed between another one of the pair of electrodes and the quantum dot layer.

The transparent light-emitting layer 2 is transparent, and includes the first to sixth light-emitting pixels L1 to L6 each containing a self-luminous quantum dot layer. The display layer 3 may be either transparent or non-transparent. Furthermore, the display layer 3 may include a self-luminous element. Alternatively, the display layer 3 may be a panel including a liquid crystal display element and a backlight.

The transparent light-emitting layer 2 is provided toward the viewing surface 17 of the display device 1, and the display layer 3 is provided across from the viewing surface 17. The transparent light-emitting layer 2 and the display layer 3 may be formed of organic or inorganic light-emitting diodes (LEDs). The transparent light-emitting layer 2 and the display layer 3 may contain quantum dots (QDs).

A pixel in the display layer 3 is provided in association with a plurality of pixels in the transparent light-emitting layer 2. Here, as illustrated in FIGS. 2 and 3, different colors overlap with each other between: colors of pixels in the transparent light-emitting layer 2; and a color of a pixel in the display layer 3.

Figure 4:
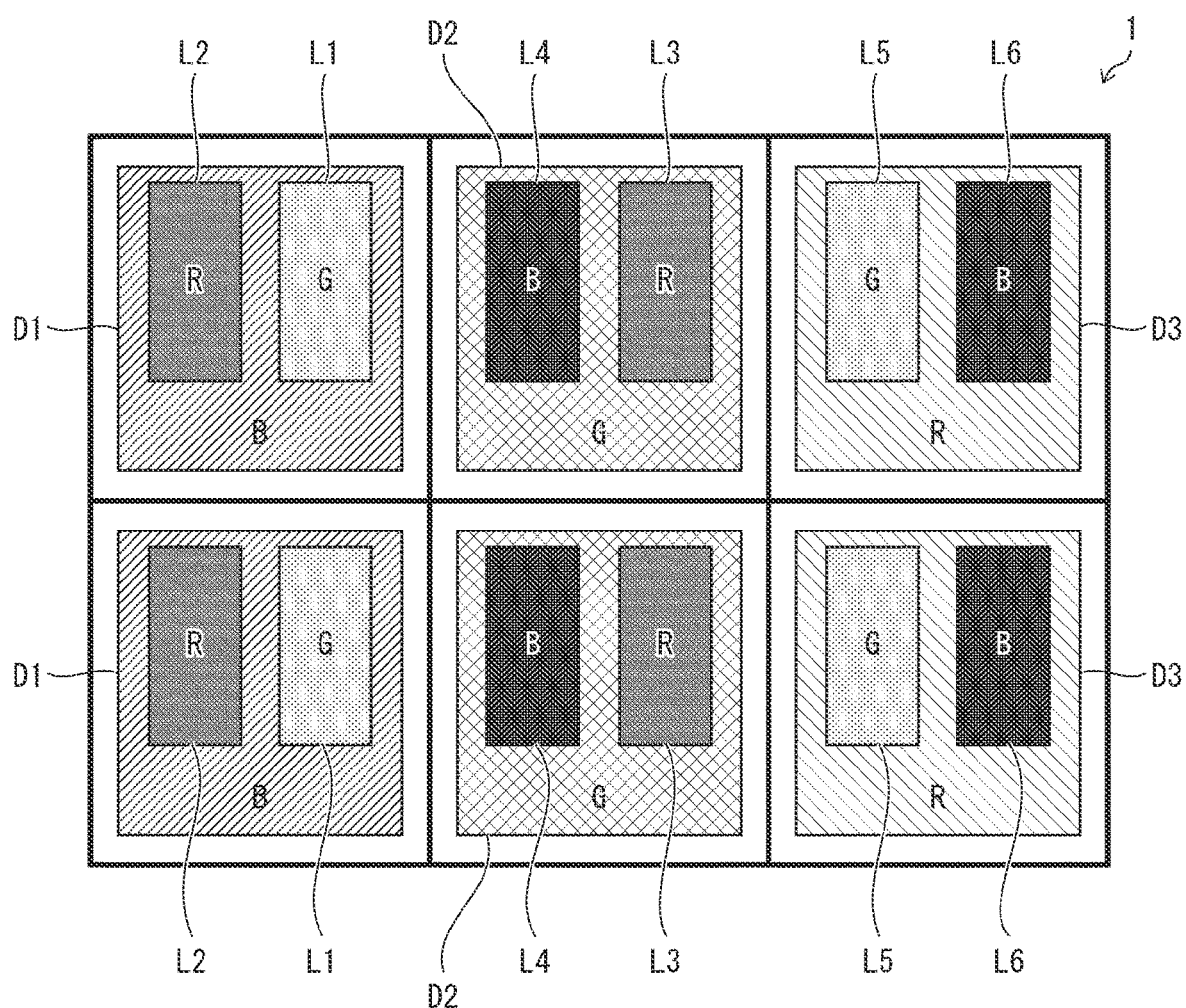
FIG. 4 is a plan view of a pixel structure of the display device.

FIG. 4 is a plan view of a pixel structure of the display device 1. In this pixel structure, a first light-emitting pixel L1 and a second light-emitting pixel L2 arranged in the transparent light-emitting layer 2, and a first display pixel D1 disposed in the display layer 3 constitute one RGB pixel. Furthermore, a third light-emitting pixel L3, a fourth light-emitting pixel L4, and a second display pixel D2 constitute one pixel. A fifth light-emitting pixel L5, a sixth light-emitting pixel L6, and a third display pixel D3 constitute one pixel. In the example illustrated in FIG. 4, six pixels are arranged in two rows and three columns.

Figure 5:
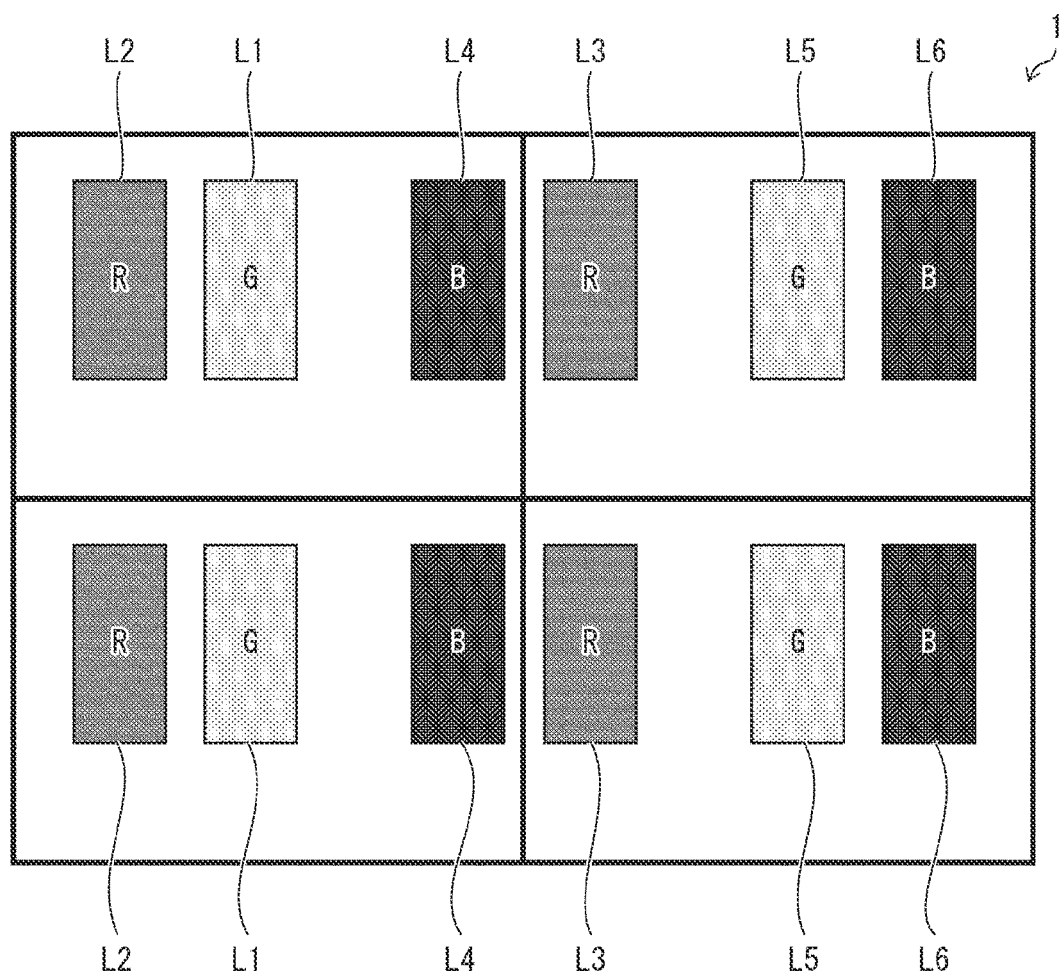
FIG. 5 is a plan view of another pixel structure of the display device.

FIG. 5 is a plan view of another pixel structure of the display device 1. In this other pixel structure, a first light-emitting pixel L1, a second light-emitting pixel L2, and a fourth light-emitting pixel L4, all of which are arranged in the transparent light-emitting layer 2, constitute one RGB pixel. Furthermore, a third light-emitting pixel L3, a fifth light-emitting pixel L5, and a sixth light-emitting pixel L6, all of which are arranged in the transparent light-emitting layer 2, constitute one pixel. In the example illustrated in FIG. 5, four pixels are arranged in two rows and two columns.

Figure 6:
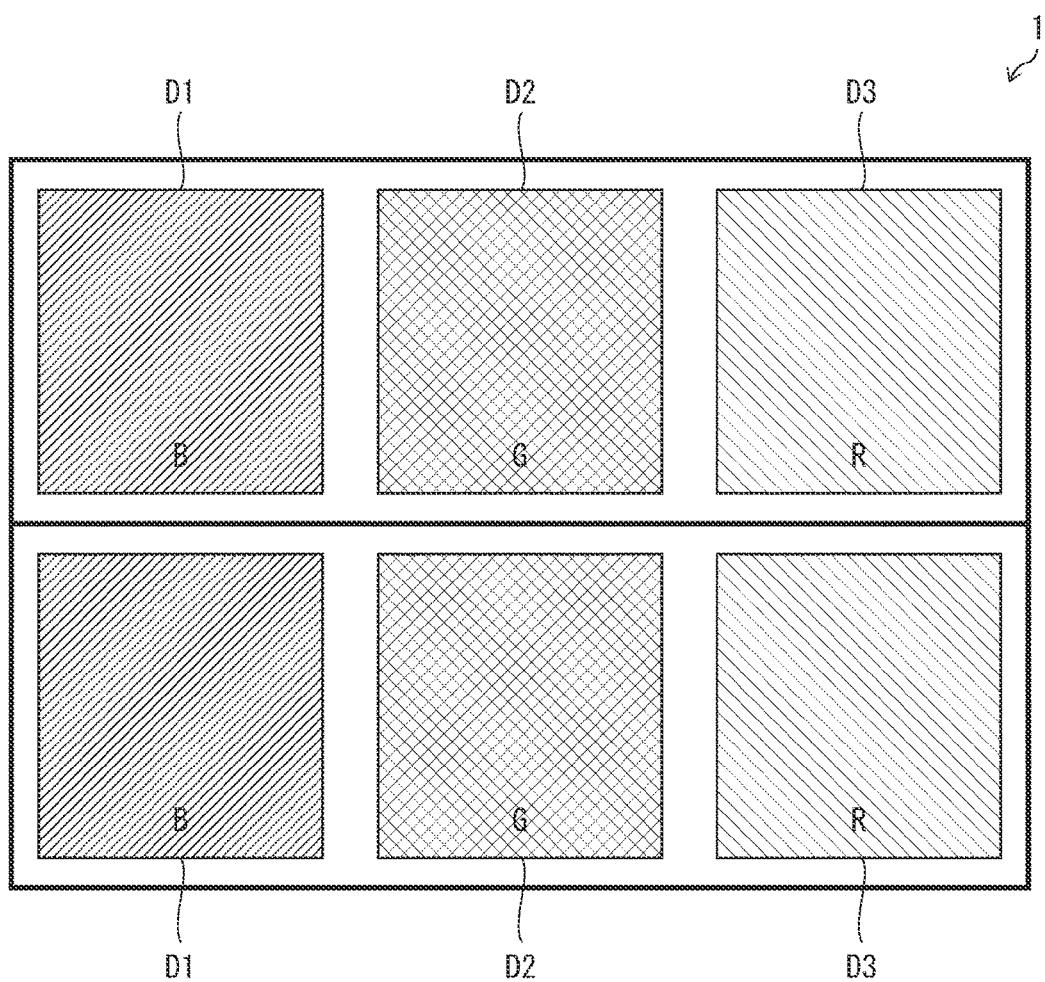
FIG. 6 is a plan view of still another pixel structure of the display device.

FIG. 6 is a plan view of still another pixel structure of the display device 1. In this still other pixel structure, a first display pixel D1, a second display pixel D2, and a third display pixel D3, all of which are arranged in the display layer 3, constitute one RGB pixel. In the example illustrated in FIG. 6, two pixels are arranged in two rows and one column.

As can be seen, in the case of the color combination illustrated in FIG. 2, an image can be displayed in three resolutions shown in FIGS. 4 to 6. As to a pixel including three subpixels of R, G, and B, considered is a case of the color combination in FIG. 2. When only the transparent light-emitting layer 2 provided above is focused, a total of four pixels; that is, horizontally two pixels and vertically two pixels, are to be arranged as illustrated in FIG. 5. Furthermore, when only the display layer 3 provided below is focused, a total of two pixels; that is, horizontally one pixel and vertically two pixels, are to be arranged as illustrated in FIG. 6. Moreover, when the first and second light-emitting pixels L1 and L2 of the transparent light-emitting layer 2 on the upper left and the first display pixel D1 of the display layer 3 represent one pixel, and the third and fourth light-emitting pixels L3 and L4 of the transparent light-emitting layer 2 on the right and the second display pixel D2 of the display layer 3 represent one pixel, a total of six pixels; that is, horizontally three pixels and vertically two pixels, can be arranged as illustrated in FIG. 4.

Among the pixel structures illustrated in FIGS. 4 to 6, the pixel structure illustrated in FIG. 4 presents an image with the highest definition.

Figure 7:
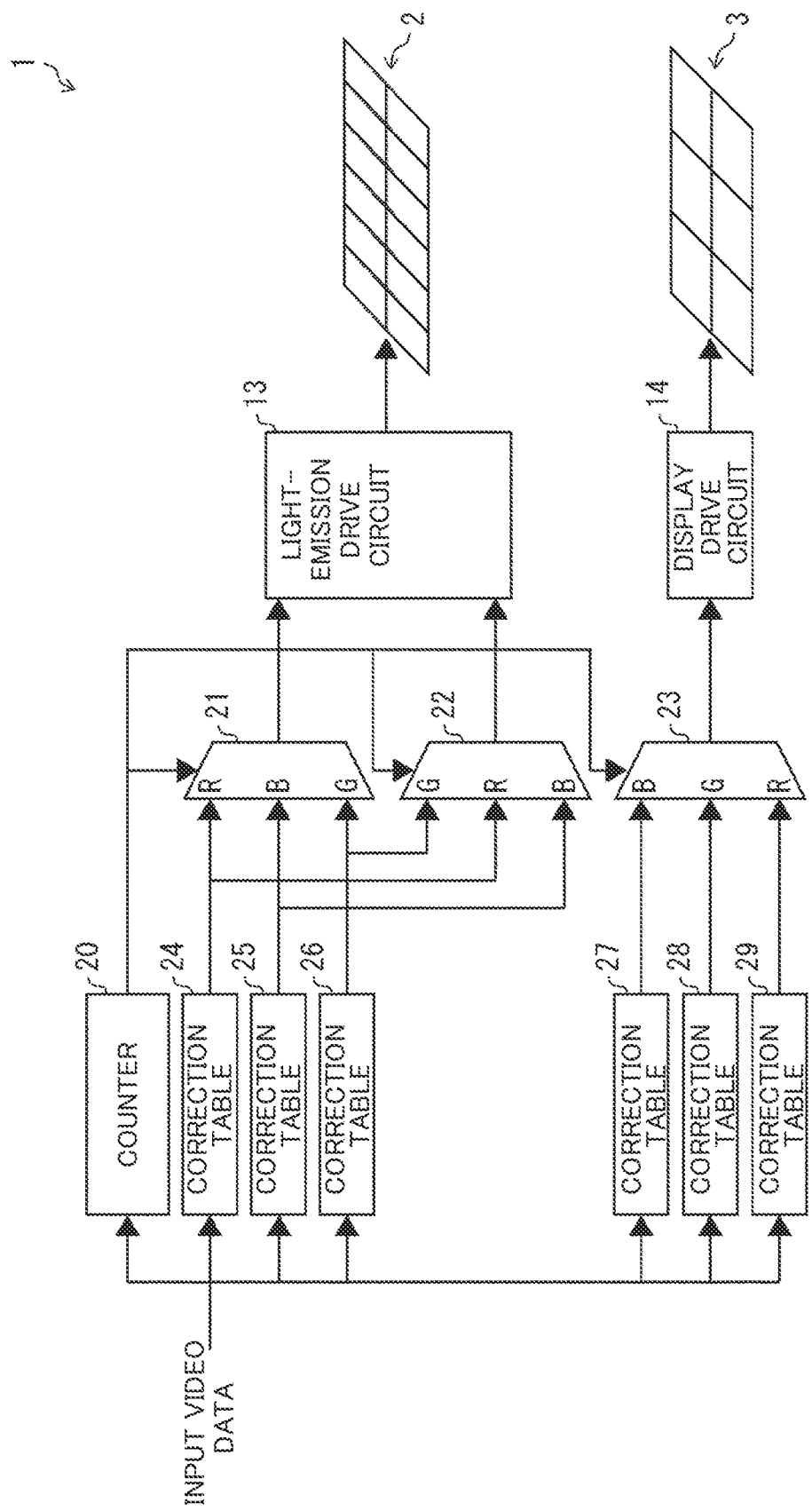
FIG. 7 is a system block diagram illustrating the display device.
Figure 8:
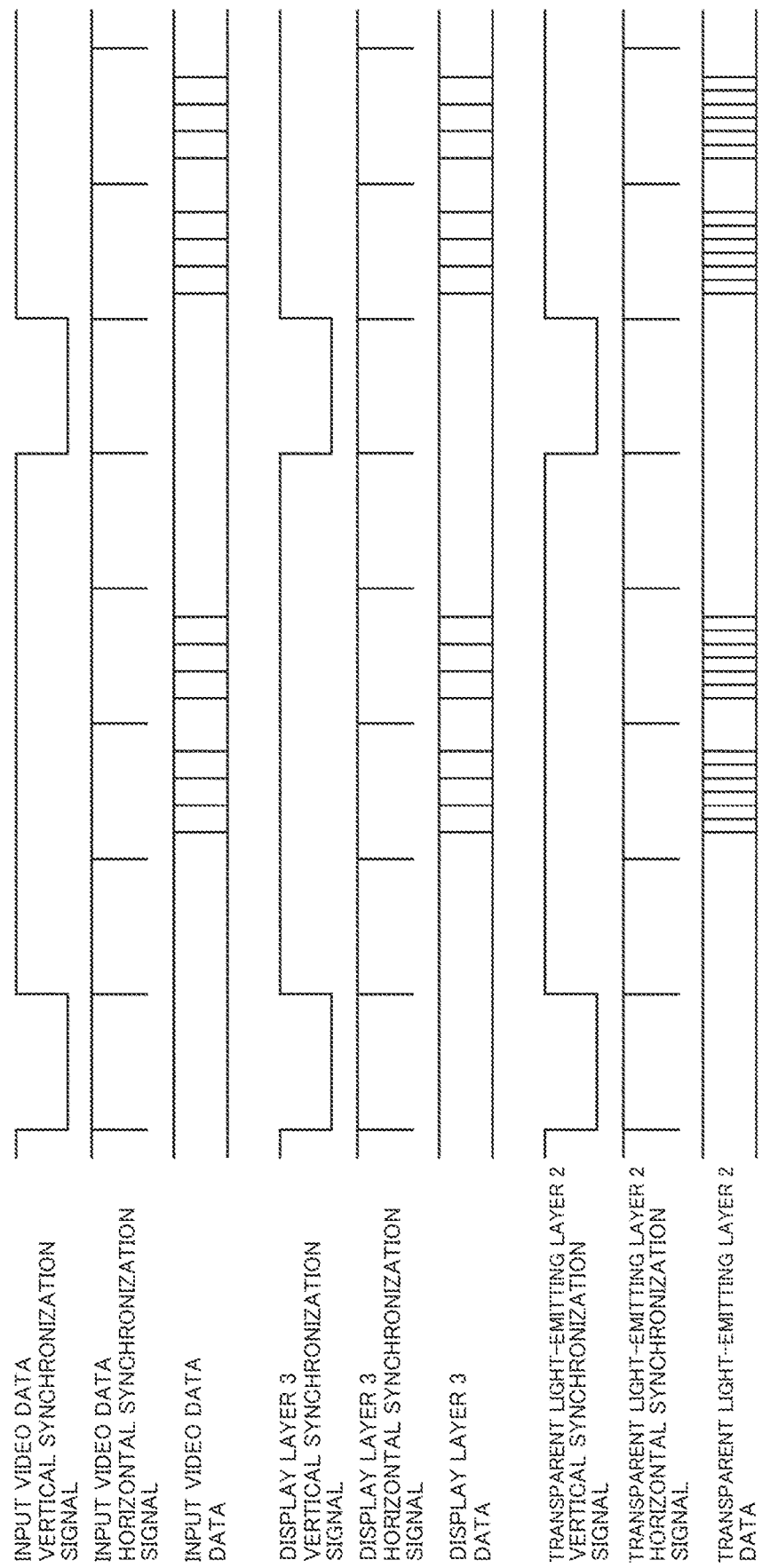
FIG. 8 is a timing diagram showing an operation of the display device.

FIG. 7 is a system block diagram illustrating the display device 1. FIG. 8 is a timing diagram showing an operation of the display device 1.

A counter 20 and selectors 21, 22, and 23 may be provided to decompose input video data into components in three colors of, for example, R (a red component), G (a green component), and B (a blue component), so that if pixels arranged in the transparent light-emitting layer 2 represent R and G, a pixel disposed in the display layer 3 represents B, if pixels in the transparent light-emitting layer 2 represent B and R, a pixel in the display layer 3 represents G, and if pixels in the transparent light-emitting layer 2 represent G and B, a pixel in the display layer 3 represents R.

Specifically, if values of three consecutive pixel data items of the input video data are (R0, G0, B0), (R1, G1, B1), and (R2, G2, B2), the transparent light-emitting layer 2 may be controlled to display (R0, G0), (B1, R1), and (G2, B2), and the display layer 3 may be controlled to display (B0), (G1), and (R2).

Note that even if the transparent light-emitting layer 2 and the display layer 3 present the same color, the light might have different intensities and properties, and if the transparent light-emitting layer 2 and the display layer 3 overlap with each other to display an image, the color changes. Hence, the transparent light-emitting layer 2 and the display layer 3 may be provided with different correction tables to correct the light so that the light appears in the same color.

As illustrated in FIG. 7, the display device 1 further includes: the selectors 21 and 22 each having an R terminal that receives a pixel data item R0 of the input video data through a correction table 24, a B terminal that receives a pixel data item B0 of the input video data through a correction table 25, and a G terminal that receives a pixel data item G0 of the input video data through a correction table 26; the selector 23 having an R terminal that receives a pixel data item R1 of the input video data through a correction table 29, a B terminal that receives a pixel data item B1 of the input video data through a correction table 27, and a G terminal that receives a pixel data item G1 of the input video data through a correction table 28; the counter 20 that gives a count value of the input video data to the selectors 21, 22, and 23; a light-emission drive circuit 13 that drives the first to sixth light-emitting pixels L1 to L6 arranged in the transparent light-emitting layer 2, in accordance with an output of the selector 21 and an output of the selector 22; and a display drive circuit 14 that drives the first to third display pixels D1 to D3 arranged in the display layer 3, in accordance with an output of the selector 23.

As can be seen, for example, light is lit with the first light-emitting pixel L1 and the second light-emitting pixel L2 of the transparent light-emitting layer 2 and the first display pixel D1 of the display layer 3. Such a feature presents light with high luminance, compared with a case where light is lit with a pixel in one layer.

When viewed from the front of the display device 1, a region for two subpixels (e.g., two subpixels including the first light-emitting pixel L1 and the second light-emitting pixel L2) can provide one pixel. Hence, the input video data can be displayed in a resolution 1.5 times as high as a resolution of the transparent light-emitting layer 2.

The display layer 3 provided below includes a fewer pixels. Hence, the amount of data to be transferred may be reduced, and a frame time may be decreased. Specifics will be described in the second and subsequent embodiments. Hence, a moving image can be rewritten at high speed in the form of a rough video, using the pixels in the display layer 3 provided below. Then, a still image is slowly rewritten in the form of a fine video, using the pixels in the transparent light-emitting layer 2 provided above.

Second Embodiment

Figure 9:
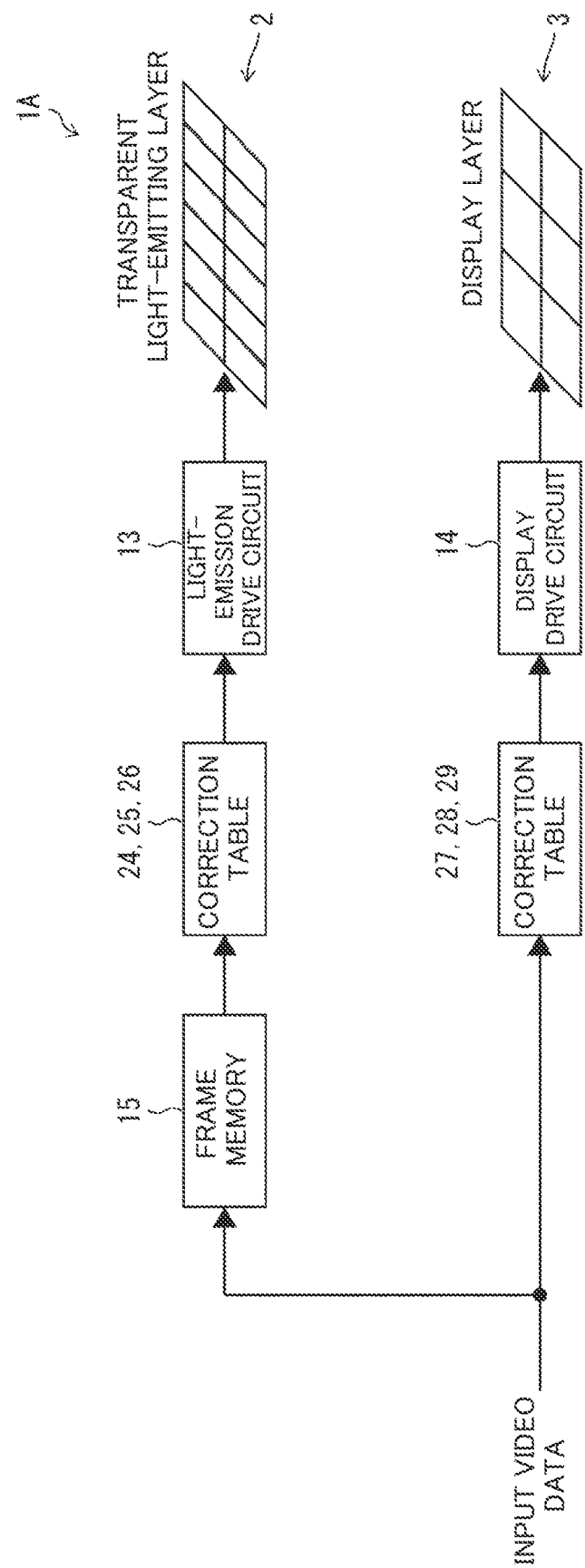
FIG. 9 is a system block diagram illustrating a display device according to a second embodiment.
Figure 10:
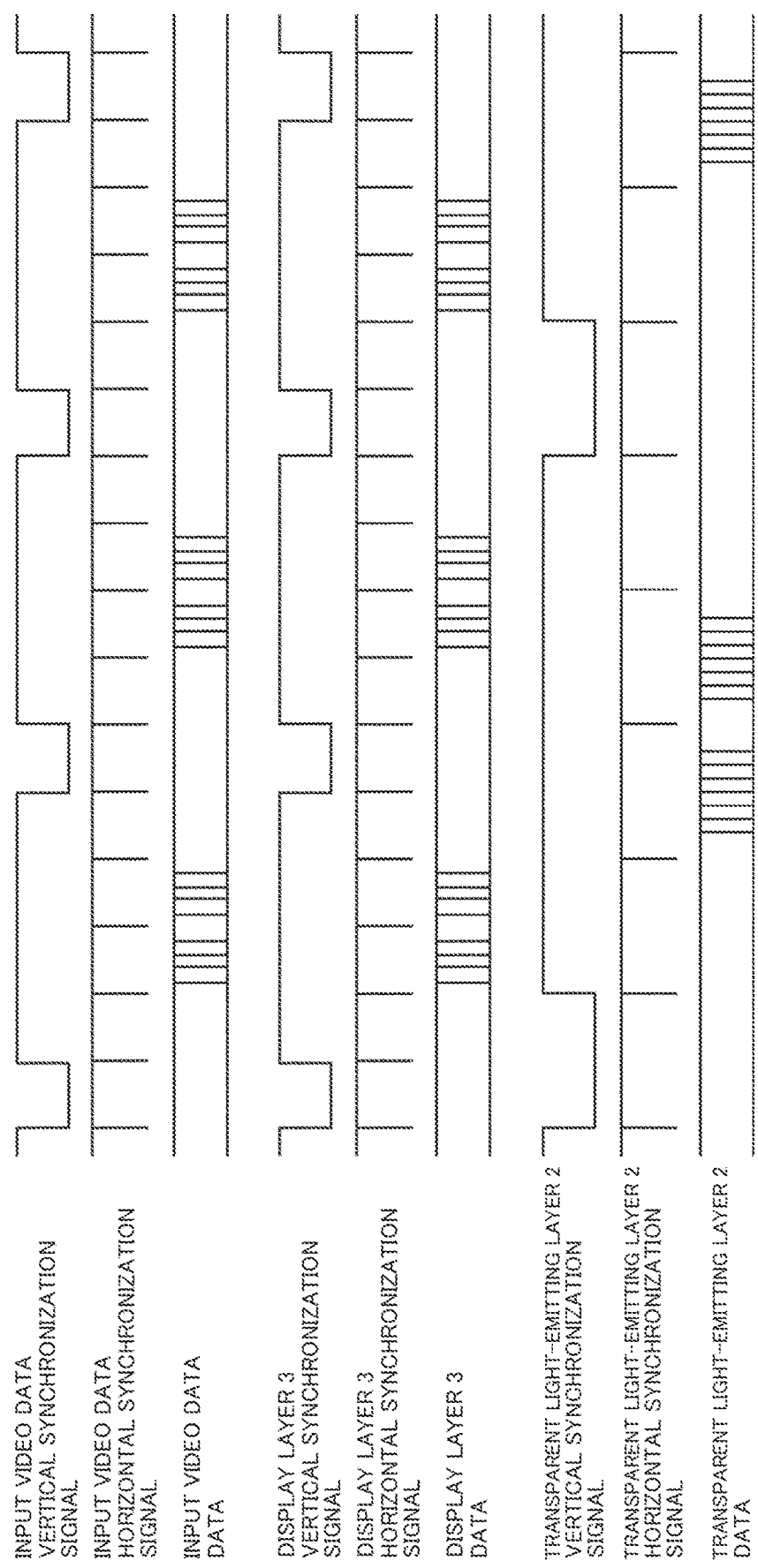
FIG. 10 is a timing diagram showing an operation of the display device.

FIG. 9 is a system block diagram illustrating a display device 1A according to a second embodiment. FIG. 10 is a timing diagram showing an operation of the display device 1A. Constituent features similar to those previously described are designated with similar reference signs, and the detailed description of such constituent features will not be elaborated upon repeatedly.

In the first embodiment, as shown in FIG. 8, the frame time that represents a period of a vertical synchronization signal is the same between the pixels of the display layer 3 and the pixels of the transparent light-emitting layer 2. However, the display layer 3 includes fewer pixels than the transparent light-emitting layer 2 does. Hence, the frame time can be decreased if the same band is used. Hence, the second embodiment exemplifies a case where the frame rate is changed between the transparent light-emitting layer 2 and the display layer 3. FIG. 9 illustrates a system block diagram, and FIG. 10 illustrates a timing diagram.

A frame time (a display frame time) for driving the first display pixels D1 arranged in the display layer 3 is shorter than a frame time (a light-emission frame time) for driving the first light-emitting pixels L1 arranged in the transparent light-emitting layer 2.

The display drive circuit 14 drives, in accordance with input video data, the first to third display pixels D1 to D3 arranged in the display layer 3. The light-emission drive circuit 13 drives, in accordance with the input video data, the first to sixth light-emitting pixels L1 to L6 arranged in the transparent light-emitting layer 2. The display device 1A further includes a frame memory 15 disposed in a preceding stage of the light-emission drive circuit 13 in order to increase the frame time (the light-emission frame time) of the input video data for the first to sixth light-emitting pixels L1 to L6.

FIGS. 9 and 10 show a case where the input video data is input in a time half the frame time of FIG. 8. For example, a video signal of 120 Hz is input to a panel whose original specification is of a 60 Hz input. Furthermore, the data is transmitted to the display layer 3 for a frame time of the input video data, and the display layer 3 displays the transmitted data. The transparent light-emitting layer 2 cannot transmit the data at the frame rate. Hence, the input video data is temporarily stored in the frame memory 15 as illustrated in FIG. 9, and transmitted with the frame time doubled. In such a case, the input video data for two frames has to be transmitted for one frame time. Hence, the image data may be reduced for one frame, or an average of two frames may be obtained. Specifically, if input images of three consecutive pixels in the n-th frame are (R0(n), G0(n), B0(n)), (R1(n), G1(n), B1(n)), and (R2(n), G2(n), B2(n)), the values to be displayed are represented as follows.

(2n)-th frame,
The display layer 3: (B0(2n)), (G1(2n)), (R2(2n)), and
The transparent light-emitting layer 2: ((R0(2n)+R0(2n+1))/2, (G0(2n)+G0(2n+1))/2), ((B1(2n)+B1(2n+1))/2, (R1(2n)+R1(2n+1))/2), ((G2(2n)+G2(2n+1))/2, (B2(2n)+B2(2n+1))/2).
(2n+1)-th frame,
The display layer 3: (B0(2n+1)), (G1(2n+1)), (R2(2n+1)), and
The transparent light-emitting layer 2: the same as the (2n)-th frame.

As can be seen, the display frame time for driving the first display pixels D1 is shorter than the light-emission frame time for driving the first light-emitting pixels L1.

Then, the display device 1A further includes: the display drive circuit 14 that drives the first display pixels D1 in accordance with the input video data; the light-emission drive circuit 13 that drives the first light-emission pixels L1 in accordance with the input video data; and the frame memory 15 disposed in a preceding stage of the light-emission drive circuit 13 in order to increase a light-emission frame time of the input video data.

Conventionally, when two panels are overlapped, a video is displayed in accordance with a longer frame time. According to this embodiment, a video can be displayed in accordance with a shorter frame time. A video in a short frame time is low in resolution. However, if the video is a moving image, the video has no problem because the viewer cannot tell the details. If the video is a still image, the video is presented in high resolution. As can be seen, the second embodiment can achieve both high definition and high frame rate.

Third Embodiment

Figure 11:
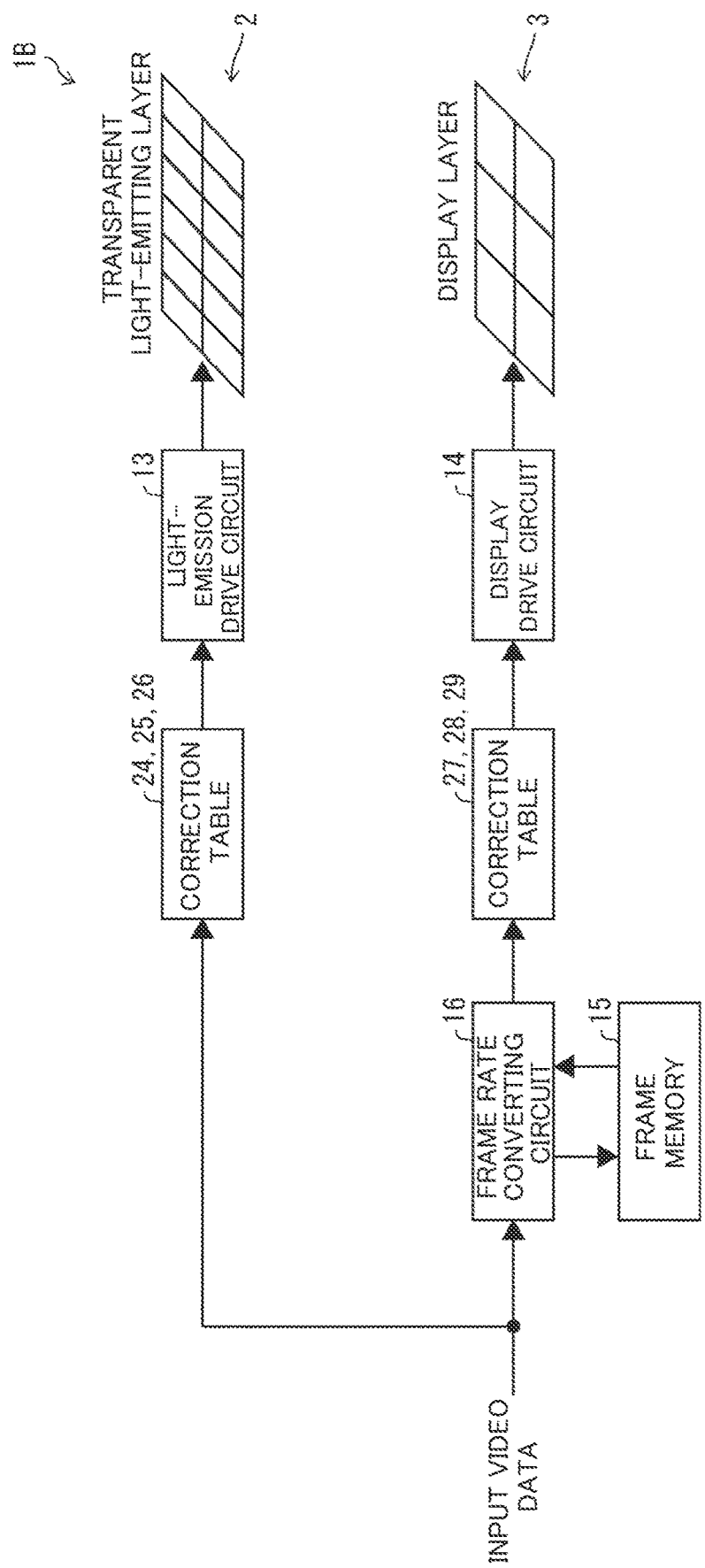
FIG. 11 is a system block diagram illustrating a display device according to a third embodiment.
Figure 12:
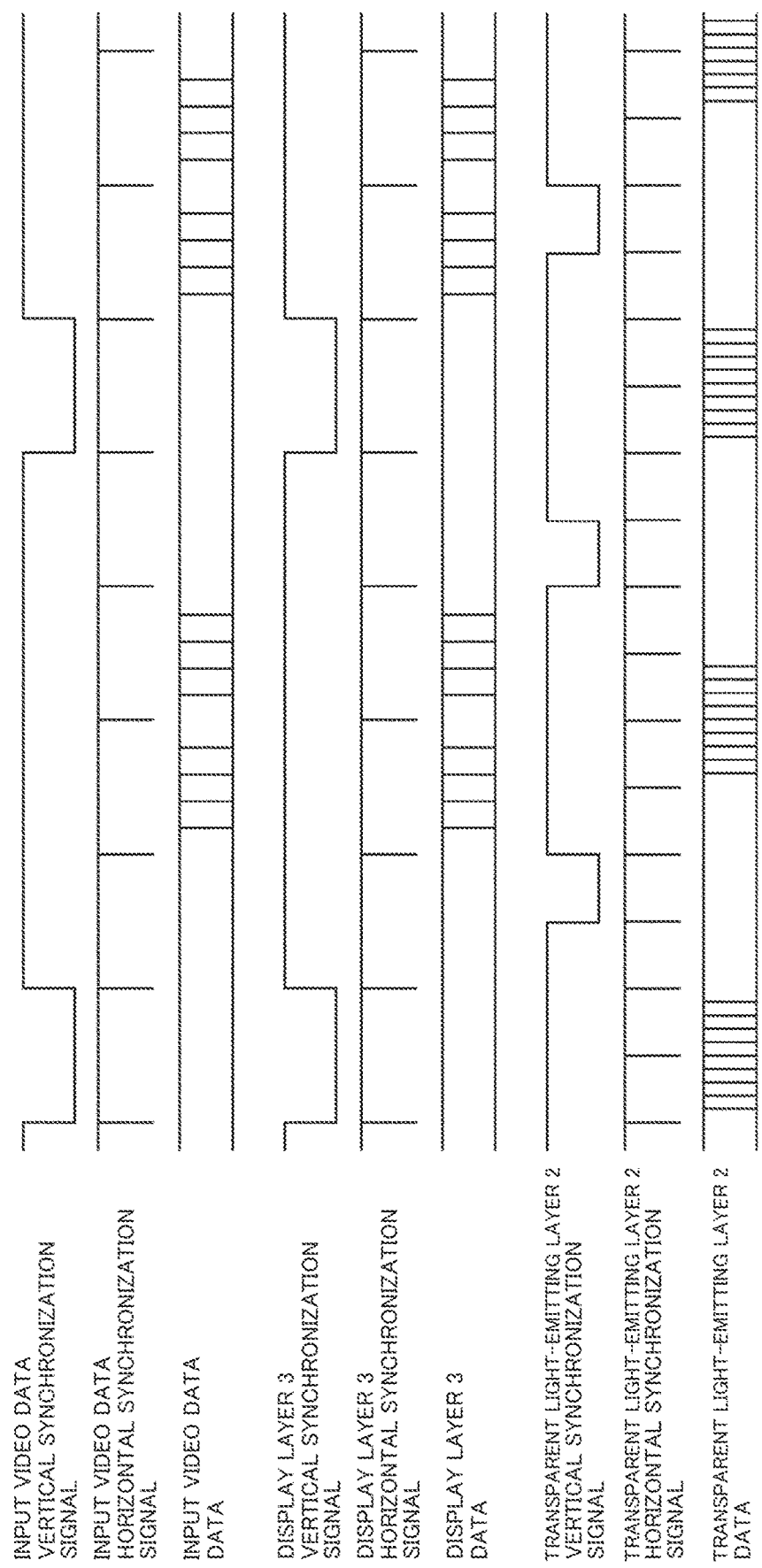
FIG. 12 is a timing diagram showing an operation of the display device.

FIG. 11 is a system block diagram illustrating a display device 1B according to a third embodiment. FIG. 12 is a timing diagram showing an operation of the display device 1B. Constituent features similar to those previously described are designated with similar reference signs, and the detailed description of such constituent features will not be elaborated upon repeatedly.

The display device 1B further includes: the display drive circuit 14 that drives the first to third display pixels D1 to D3 of the display layer 3 in accordance with input video data; the light-emission drive circuit 13 that drives the first to sixth light-emission pixels L1 to L6 of the transparent light-emitting layer 2 in accordance with the input video data; and a frame rate converting circuit 16 and the frame memory 15 disposed in a preceding stage of the display drive circuit 14 in order to decrease a frame time (a display frame time) of the input video data.

In the second embodiment, the frame time of the input video data is halved.

The third embodiment exemplifies a case where the frame rate converting circuit 16 generates video data whose frame time is halved, and the video data is displayed using the display layer 3.

FIGS. 11 and 12 show that the input video data for the same frame time as the frame time in FIG. 8 is input, and that the frame rate converting circuit 16 generates video data whose frame time is halved. The frame rate converting circuit 16 may output either the same video data twice, or video data temporally interpolated with the motion predicted.

Furthermore, the data is transmitted to the transparent light-emitting layer 2 for a frame time of the input video data, and the transmitted data is displayed using the transparent light-emitting layer 2. The display layer 3 transmits the video data generated by the frame rate converting circuit 16 to have the frame time halved.

As can be seen, the display device 1B further includes: the display drive circuit 14 that drives the first display pixels D1 in accordance with the input video data; the light-emission drive circuit 13 that drives the first light-emission pixels L1 in accordance with the input video data; and the frame rate converting circuit 16 that is disposed in a preceding stage of the display drive circuit 14 in order to decrease a display frame time of the input video data.

The frame rate converting circuit 16 converts only the video data of the display layer 3. Such a feature can reduce the number of pixels associated with video data to be converted, compared with a case where the video data of the transparent light-emitting layer 2 is also converted. In the example of this embodiment, the amount of data to be converted is reduced to one third. Hence, compared with a case where all the input video data is converted into frame rates, the capacity of the frame memory 15 and the arithmetic processing can be reduced to one third. As can be seen, compared with a monitor having the known frame rate converting circuit 16, this embodiment can achieve both high definition and high frame rate while reducing resources such as a memory and circuits.

Fourth Embodiment

Figure 13:
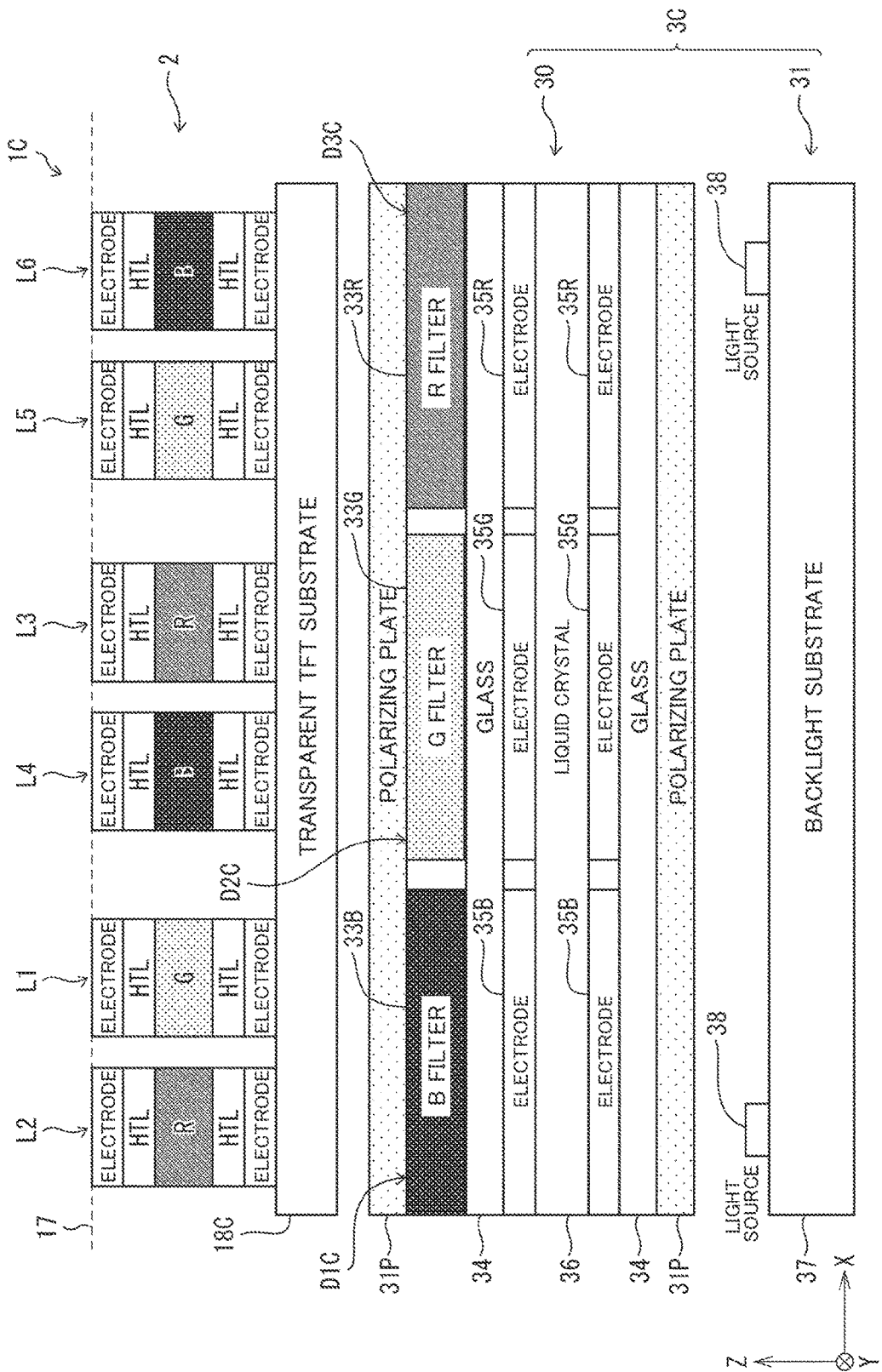
FIG. 13 is a cross-sectional view of a display device according to a fourth embodiment.

FIG. 13 is a cross-sectional view of a display device 1C according to a fourth embodiment. Constituent features similar to those previously described are designated with similar reference signs, and the detailed description of such constituent features will not be elaborated upon repeatedly.

The display device 1C includes: the transparent light-emitting layer 2 provided toward the viewing surface 17; and a display layer 3C provided across from the viewing surface 17. The display layer 3C has: a liquid crystal panel 30; and a backlight 31 provided across from the viewing surface 17 of the liquid crystal panel 30.

The liquid crystal panel 30 includes: a pair of polarizing plates 31P; a color filter 33B formed between the polarizing plates 31P in association with the first and second light-emitting pixels L1 and L2, in order to transmit a blue light; a color filter 33G formed between the polarizing plates 31P in association with the third and fourth light-emitting pixels L3 and L4, in order to transmit a green light; a color filter 33R formed between the polarizing plates 31P in association with the fifth and sixth light-emitting pixels L5 and L6, in order to transmit a red light; a pair of glass substrates 34 arranged between the color filters 33R, 33G, and 33B and the polarizing plates 31P; a pair of electrodes 35B formed on the pair of glass substrates 34 in association with the color filter 33B; a pair of electrodes 35G formed on the pair of glass substrates 34 in association with the color filter 33G; a pair of electrodes 35R formed on the pair of glass substrates 34 in association with the color filter 33R; and a liquid crystal layer 36 formed between the pair of glass substrates 34.

The backlight 31 includes: a backlight substrate 37; and a light source 38 disposed on the backlight substrate 37.

The color filter 33B, the pair of electrodes 35B, the liquid crystal layer 36, and the backlight 31 constitute a first display pixel D1C. Furthermore, the color filter 33G, the pair of electrodes 35G, the liquid crystal layer 36, and the backlight 31 constitute a second display pixel D2C. The color filter 33R, the pair of electrodes 35R, the liquid crystal layer 36, and the backlight 31 constitute a third display pixel D3C.

The structure of the display device 1C observed from the viewing surface 17 is the same as the structure illustrated in FIG. 2 of the first embodiment. The structure of the display device 1C observed in perspective is the same as the structure illustrated in FIG. 3.

The backlight 31 may include: a light-emitting unit that emits a blue light and an ultraviolet ray; and a sheet containing a phosphor and quantum dots (QDs).

The liquid crystal display element, which is lower in response speed than a self-luminous display element, achieves remarkable advantageous effects when the frame time is made shorter than the frame time of the first to sixth light-emitting pixels L1 to L6 of the transparent light-emitting element 2, and the frame rate is raised.

Fifth Embodiment

Figure 14:
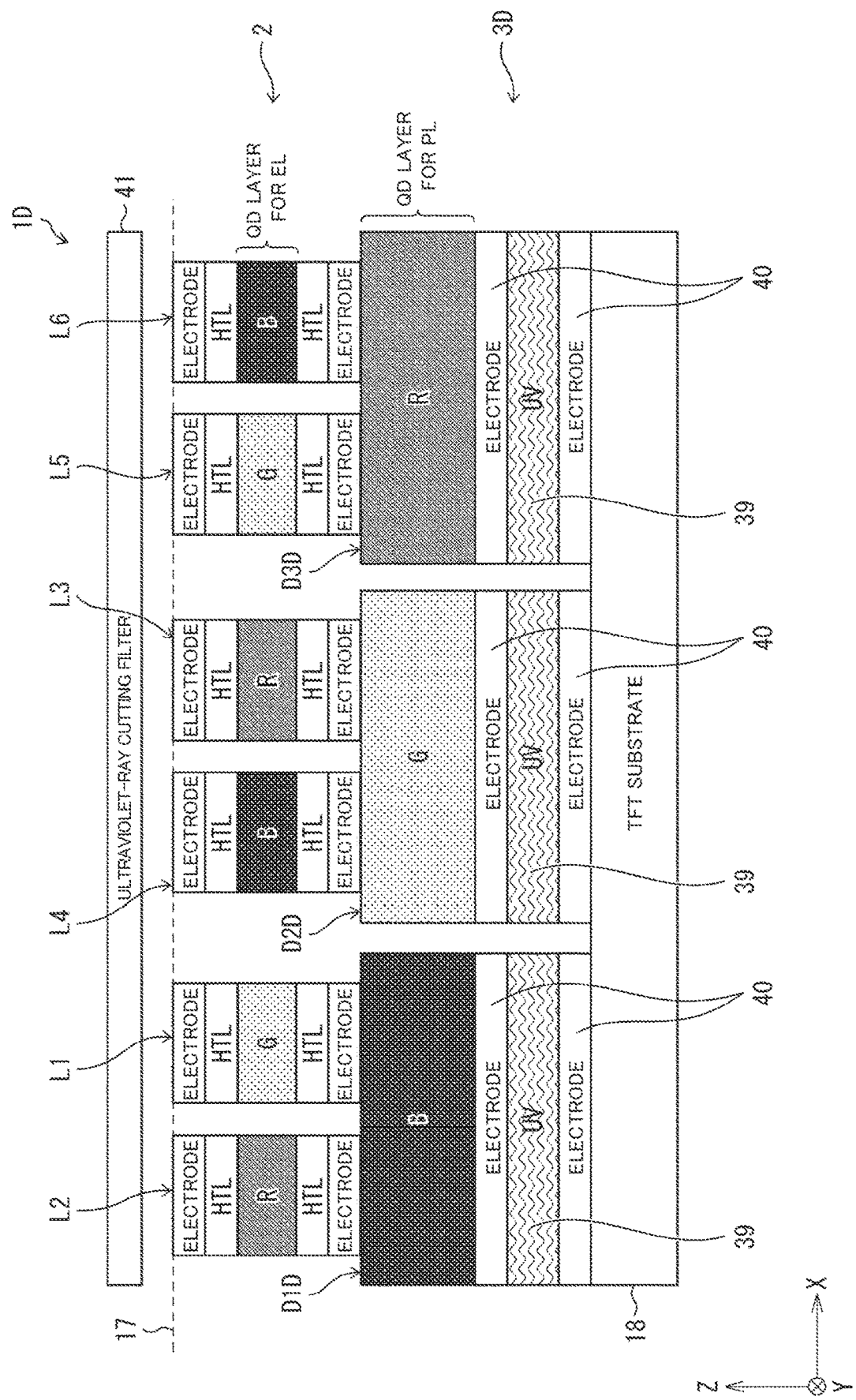
FIG. 14 is a cross-sectional view of a display device according to a fifth embodiment.
Figure 15:
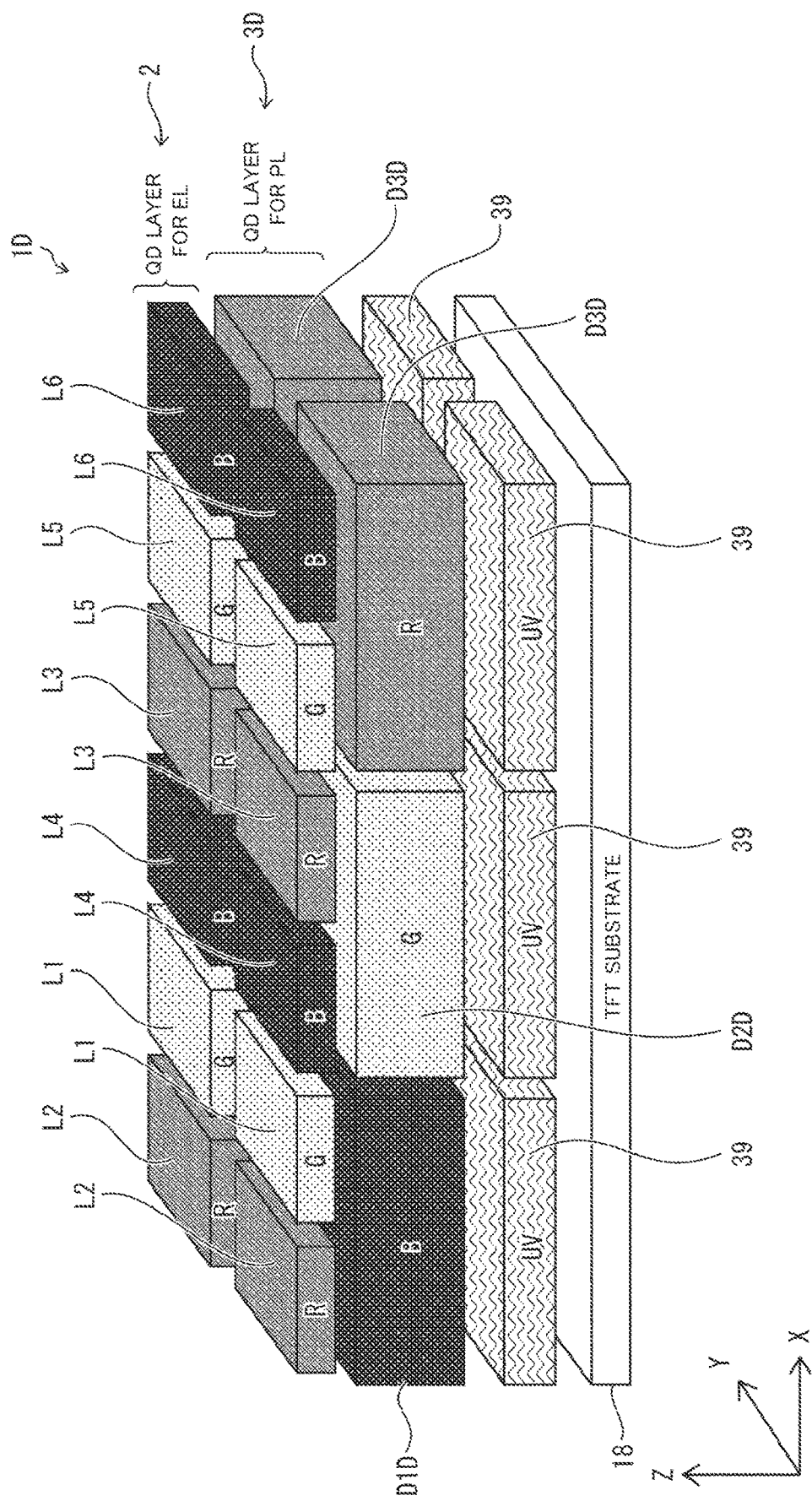
FIG. 15 is a perspective view of an essential portion of the display device.

FIG. 14 is a cross-sectional view of a display device 1D according to a fifth embodiment. FIG. 15 is a perspective view of an essential portion of the display device 1D. Constituent features similar to those previously described are designated with similar reference signs, and the detailed description of such constituent features will not be elaborated upon repeatedly.

The display device 1D includes: the transparent light-emitting layer 2 provided toward the viewing surface 17; and a display layer 3D provided across from the viewing surface 17. The display layer 3D includes: a first display pixel D1D disposed in association with the first light-emitting pixel L1 and the second light-emitting pixel L2 in order to emit light in the third color (blue) different from the first color (green) and the second color (red) by photoluminescence (PL); a second display pixel D2D provided adjacent to the first display pixel D1D in the X-direction in order to emit light in the first color (green) by PL; and a third display pixel D3D provided adjacent to the second display pixel D2D in the X-direction in order to emit light in the second color (red) by PL.

The second display pixel D2D is disposed in association with the third and fourth light-emitting pixels L3 and L4. The third display pixel D3D is disposed in association with the fifth and sixth light-emitting pixels L5 and L6.

The display layer 3D further includes: an ultraviolet-ray light source 39 that supplies the first display pixel D1D with an ultraviolet-ray; an ultraviolet-ray light source 39 that supplies the second display pixel D2D with an ultraviolet ray; and an ultraviolet-ray light source 39 that supplies the third display pixel D3D with an ultraviolet ray. Each of the ultraviolet-ray light sources 39 has opposing sides provided with electrodes 40. The first to third display pixels D1D to D3D emit light in accordance with an ultraviolet ray supplied from each ultraviolet-ray light source 39.

Across from the display layer 3D of the transparent light-emitting layer 2, an ultraviolet-ray cutting filter 41 is provided to absorb ultraviolet rays supplied from the ultraviolet-ray light sources 39.

The display device 1D according to the fifth embodiment uses quantum dots for both the transparent light-emitting layer 2 and the display layer 3D. That is why the display device 1D can reproduce a variety of colors. Furthermore, the transparent light-emitting layer 2 is provided with the first to sixth light-emitting pixels L1 to L6 containing quantum dots. That is why the transparent light-emitting layer 2 can exhibit high transmittance.

The first to third display pixels D1D to D3D of the display layer 3D are excited by ultraviolet rays to emit light. That is why the first to third display pixels D1D to D3D can emit light at high luminance, and suffer little degradation.

Figure 16:
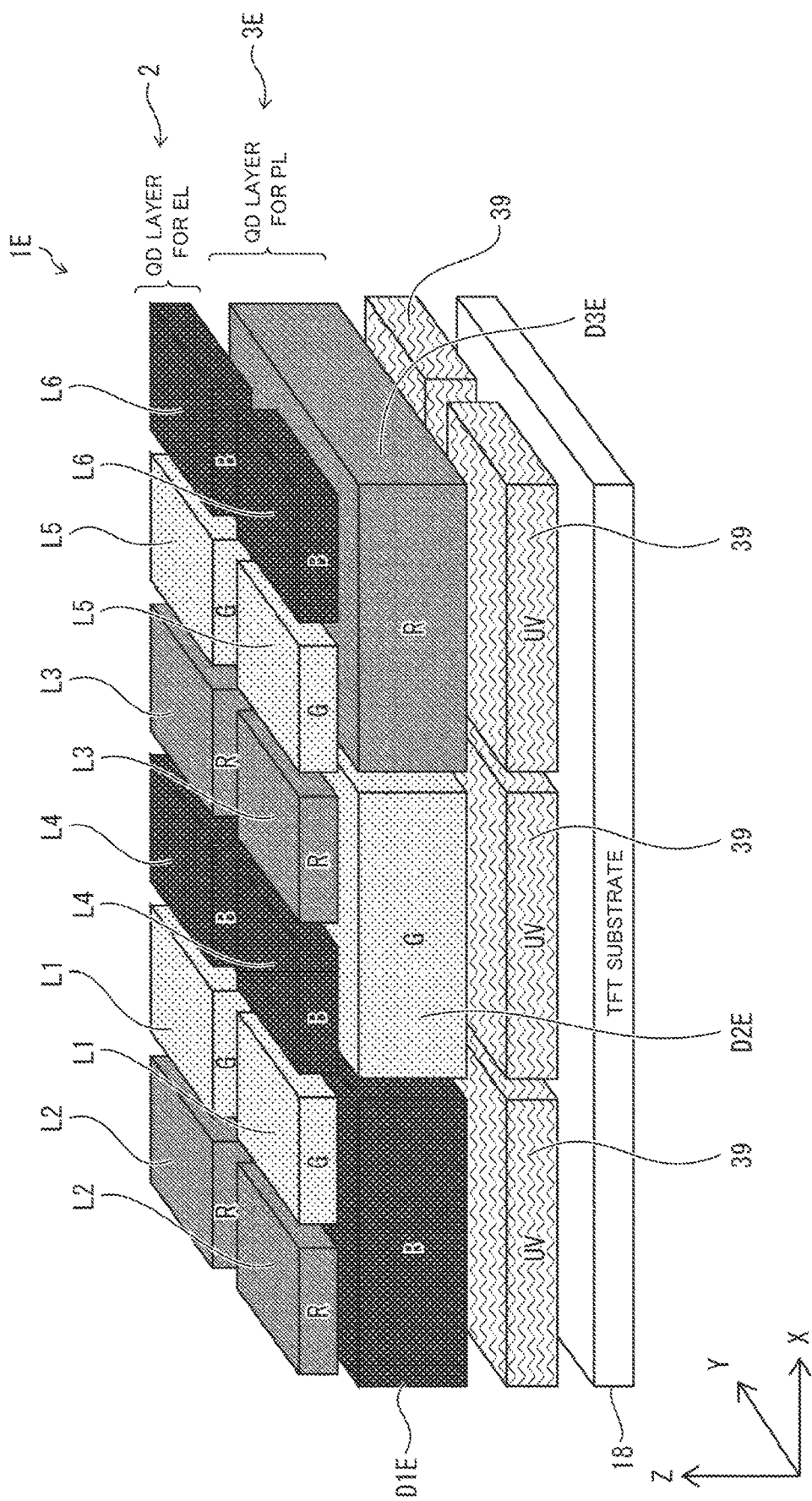
FIG. 16 is a perspective view of an essential portion of the display device in a modification.

FIG. 16 is a perspective view of an essential portion of a display device 1E according to a modification. Constituent features similar to those previously described are designated with similar reference signs, and the detailed description of such constituent features will not be elaborated upon repeatedly.

The display device 1E includes: the transparent light-emitting layer 2; and a display layer 3E. The display layer 3E includes: a first display pixel D1E disposed in association with two first light-emitting pixels L1 and two second light-emitting pixels L2 in order to emit light in the third color (blue) by PL; a second display pixel D2E disposed in association with two third light-emitting pixels L3 and two fourth light-emitting pixels L4 in order to emit light in the first color (green) by PL; and a third display pixel D3E disposed in association with two fifth light-emitting pixels L5 and two sixth light-emitting pixels L6 in order to emit light in the second color (red) by PL.

As can be seen, each of the first to third display pixels D1E to D3E may be provided across four light-emitting pixels. As a result, the area of the first to third display pixels D1E to D3E to emit light by PL is larger than the area of the first to third display pixels D1D to D3D. Such a feature facilitates application of the QDs during the production of the pixels.

The display device 1E according to the fifth embodiment uses quantum dots for both of the layers; namely, the transparent light-emitting layer 2 and the display layer 3E. That is why the display device 1E can enlarge the color gamut. Furthermore, in the production, the material of the QDs can be shared in a region associated with four light-emitting pixels of two rows and two columns.

The disclosure shall not be limited to the embodiments described above, and can be modified in various manners within the scope of claims. The technical aspects disclosed in different embodiments are to be appropriately combined together to implement another embodiment. Such an embodiment shall be included within the technical scope of the disclosure. Furthermore, the technical aspects disclosed in each embodiment may be combined to achieve a new technical feature.

The invention claimed is:

1. A display device, comprising:
a transparent light-emitting layer provided toward a viewing surface; and
a display layer provided across from the viewing surface,
wherein the transparent light-emitting layer has a first light-emitting pixel and a second light-emitting pixel provided adjacent to each other in a first direction parallel to the viewing surface, and configured to emit light respectively in a first color and a second color different from each other,
the display layer has: a first display pixel disposed in association with the first light-emitting pixel and the second light-emitting pixel, and configured to emit light in a third color different from the first color and the second color; and a second display pixel provided adjacent to the first display pixel in the first direction, and configured to emit light in the first color, and
the transparent light-emitting layer further has a third light-emitting pixel and a fourth light-emitting pixel arranged in association with the second display pixel, and configured to emit light respectively in the second color and the third color,
wherein the display layer further has a third display pixel provided adjacent to the second display pixel in the first direction, and configured to emit light in the second color, and
the transparent light-emitting layer further has a fifth light-emitting pixel and a sixth light-emitting pixel arranged in association with the third display pixel, and configured to emit light respectively in the first color and the third color.

2. The display device according to claim 1,
wherein the first light-emitting pixel and the fourth light-emitting pixel are provided adjacent to each other in the first direction.

3. The display device according to claim 1,
wherein a display frame time for driving the first display pixel is shorter than a light-emission frame time for driving the first light-emitting pixel.

4. The display device according to claim 3, further comprising:
a display drive circuit configured to drive the first display pixel in accordance with input video data;

a light-emission drive circuit configured to drive the first light-emitting pixel in accordance with the input video data; and a frame memory disposed in a preceding stage of the light-emission drive circuit, and configured to increase the light-emission frame time of the input video data.

5. The display device according to claim 3, further comprising:

a display drive circuit configured to drive the first display pixel in accordance with input video data;

a light-emission drive circuit configured to drive the first light-emitting pixel in accordance with the input video data; and a frame rate converting circuit disposed in a preceding stage of the display drive circuit, and configured to decrease the display frame time of the input video data.

6. The display device according to claim 1, wherein the first to the third display pixels are arranged adjacent to each other in a second direction intersecting with the first direction, and the first to the sixth light-emitting pixels are arranged adjacent to each other in the second direction.

7. The display device according to claim 1, wherein the first light-emitting pixel includes: a pair of electrodes; a quantum dot layer formed between the pair of electrodes; a hole transport layer formed between one of the pair of electrodes and the quantum dot layer; and an electron transport layer formed between another one of the pair of electrodes and the quantum dot layer.

8. The display device according to claim 1, wherein the first light-emitting pixel includes either an organic or an inorganic electroluminescent layer.

9. The display device according to claim 1, wherein the first display pixel includes either an organic or an inorganic electroluminescent layer.

10. The display device according to claim 1, wherein the first display pixel includes a liquid crystal panel and a backlight.

11. The display device according to claim 1, wherein the first display pixel includes an ultraviolet-ray light source configured to emit light by photoluminescence and supply the first display pixel with an ultraviolet ray.

* * * * *